United States Patent [19]
Lehto et al.

[11] Patent Number: 5,083,234
[45] Date of Patent: Jan. 21, 1992

[54] MULTILAYER TRANSDUCER WITH BONDED CONTACTS AND METHOD FOR IMPLEMENTATION OF BONDING

[75] Inventors: Ari Lehto, Helsinki; Juha Lahdenperä, Vantaa; Heikki Kuisma, Helsinki, all of Finland

[73] Assignee: Vaisala Oy, Helsinki, Finland

[21] Appl. No.: 553,597

[22] Filed: Jul. 18, 1990

[30] Foreign Application Priority Data

Aug. 17, 1989 [FI] Finland ................................ 893874

[51] Int. Cl.$^5$ .............................................. H01G 7/00
[52] U.S. Cl. ...................................... 361/283; 29/25.42
[58] Field of Search ............... 361/306, 320, 321, 308, 361/309, 310, 283, 403, 404; 29/25, 41, 592.1, 594; 73/718, 724; 357/26

[56] References Cited

U.S. PATENT DOCUMENTS

| | | | |
|---|---|---|---|
| 4,267,634 | 5/1981 | Wellard | 29/620 |
| 4,386,453 | 6/1983 | Glachino et al. | 29/25.41 |
| 4,597,027 | 6/1986 | Lehto | 361/283 |

OTHER PUBLICATIONS

"Laser direct writing of aluminum conductors by T. Cacouris et al.", Appl. Phys. Lett. 52 (22), 30 May 1988, pp. 1865–1867.

"Laser Inducted Chemical Vapor Deposition", by Dieter Baule, *Laser Processing and Diagnostics*, pp. 166–181, Jul. 1984.

"Laser microchemistry for direct writing of microstructures", by R. M. Osgood, Jr., *Laser Processing of Semiconductor Devices*, SPIE, pp. 111–117, Jan. 1983.

"Low-temperature refractory metal film deposition", by R. Solanki et al., *Appl. Phys. Lett. 41(11)*, 1 Dec. 1982, pp. 1048–1050.

*Primary Examiner*—Donald A. Griffin

[57] ABSTRACT

In a novel multilayer transducer (1') with bonded contacts and a method for fabricating the bonded contact areas (5') of the transducer, the contact areas (5') are formed on the side surface (7) of the transducer by metal deposition using laser-based deposition, sputter deposition or another suitable metallization method. By virtue of the fabrication method of the contact areas, the size of the transducer (1') can be reduced and the transducer (1') can be bonded to a circuit board using surface-mount technology.

15 Claims, 2 Drawing Sheets

MULTILAYER TRANSDUCER WITH BONDED CONTACTS AND METHOD FOR IMPLEMENTATION OF BONDING

FIELD OF THE INVENTION

The present invention relates to a multilayer transducer with bonded contacts.

The invention also concerns a method for implementing the bonding operation.

The invention is intended to be used for making electrical contacts into multilayer semiconductor structures, particularly transducers, which are fabricated onto a wafer substrate into a matrix of tens or even hundreds per wafer. After the fabrication process the wafer is divided into separate transducer chips typically by sawing. Each individual transducer comprises several conductive layers extending to the sawed surfaces. The conductive layers are galvanically isolated from each other.

DESCRIPTION OF THE PRIOR ART

Electrical contacts to external circuits are generally made via separate contact areas. A contact area is a metallized, generally square area which can be used for bonding electrical conductors routed from the electronics circuit board. The contact area is electrically connected inside the transducer to appropriate parts of the sensor structure. A conventional transducer structure is shown in FIG. 1. The construction is representative of the state-of-the-art technology and known from, e.g., U.S. Pat. No. 4,597,027.

Contact areas of the type described above are placed in a transducer on a single bonding plane which is parallel with the planar substrate, because such bonding areas are easy to make by, e.g., photolithography and vacuum deposition by evaporation prior to the dicing of the transducer wafer. The bonding plane area reserved for the contact areas increases, and the external dimensions of the transducer increase quite substantially. Because the transducer size has a linear contribution to the unit cost of the transducer, it is in the manufacturer's major interest to design the transducer with a physical area as small as possible. Consequently, the existence of contact areas of the conventional technology increases the cost of the transducer. Another disadvantage is the cumbersome formation of ohmic contacts from inside the transducer to the contact areas of the bonding plane, since the manufacturing process must provide some kind of means to prevent short-circuiting of the ohmic conductors to other conductive parts of the transducer.

SUMMARY OF THE INVENTION

The aim of the present invention is to overcome the disadvantages of prior-art technology described above and to achieve a novel type of multilayer transducer with bonded contacts as well as a method for the implementation of said bonding.

The invention is based on forming the contacts to those vertical walls of the conductive layers of the transducer that are formed when the transducer is finally diced from the fabricated wafer. In other words, the invention is characterized by fabricating the conductive layer areas to be used for bonding onto such surfaces that are not any of the original surfaces in the planar or wafer-like base materials.

The invention achieves significant benefits.

Firstly, the area of the transducer chip can be decreased by a third, thereby resulting in a corresponding reduction in the fabrication cost of the transducer. This has a profound importance if the transducer is fabricated using mass-production processes. Secondly, the transducer construction is simplified, because there is no need to route the ohmic contacts of the transducer to the outside of the sensor area. A third benefit is that the transducer structure in accordance with the invention can be bonded to a circuit board using, e.g., surface-mount technology, while a conventional structure needs wire bonding.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

This invention is next examined in detail with the help of an exemplifying embodiment illustrated in the attached drawings which are given by way of illustration only, and thus are not limitative of the present invention and wherein.

DETAILED DESCRIPTION OF THE PREFERRED EMBODIMENTS

Figure 1:
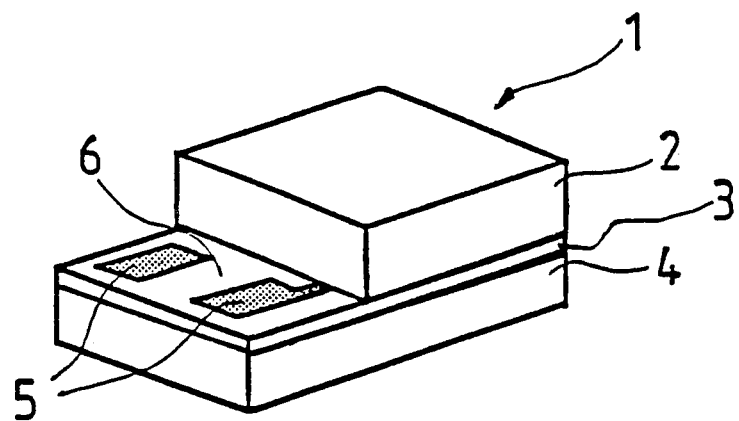
FIG. 1 shows the ohmic bonding of a conventional transducer in a perspective view.

Illustrated in FIG. 1 is a conventional transducer 1 comprising a first semiconductive layer 2 and a second semiconductive layer 4, together with an insulating layer 3 between the semiconductive layers. Over the bonding plane 6 there are formed contact areas 5. The bonding plane 6 is structurally an extension of the second semiconductive layer 4, and the ohmic contacts are routed from, e.g., the first semiconductive layer 2 within the transducer structure to the bonding plane 6.

Figure 2:
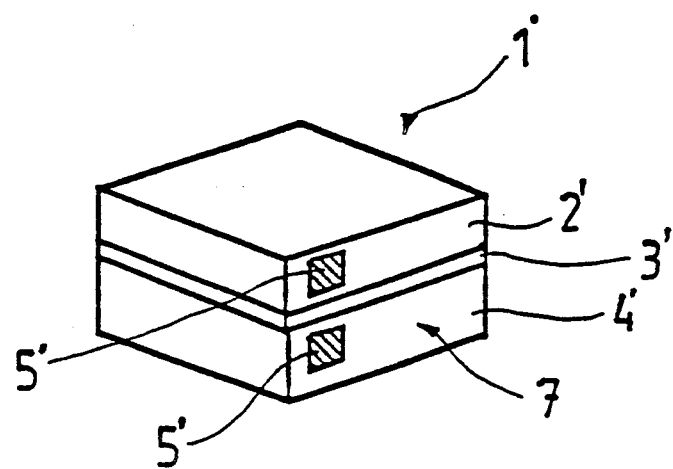
FIG. 2 shows in a similar manner a transducer, in accordance with the invention in a perspective view.

The method of contact formation in accordance with the invention is illustrated in FIG. 2. A typical transducer chip 1' comprises two or several conductive semiconductive layers 2' and 4' to which contact areas 5' are formed on a vertical side 7 of the transducer chip. A layer 3' is an electrically insulating layer between the semiconductive layers 2' and 4'.

Figure 3:
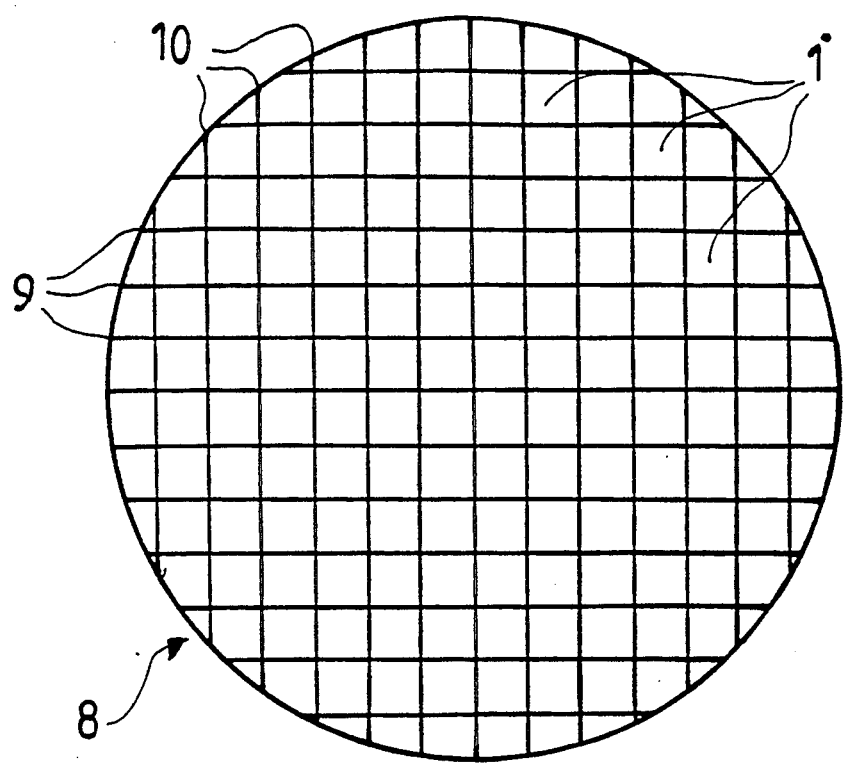
FIG. 3 shows in a top view a planar substrate from which the transducer can be diced in accordance with the invention.

Illustrated in FIG. 3 is a typical multilayer wafer 8 with a matrix pattern in which the matrix elements 1' represent the individual transducer elements. The transducer elements 1' are typically separated from the wafer 8 by mechanical means by sawing along lines 9 and 10. Alternatively, a laser can be used for separating the transducers 1'.

The structure shown in FIG. 2 has no contact planes in the sense of the conventional technology, while the contact areas 5' are fabricated directly to the side surface 7 of the transducer chip using, e.g., laser-based deposition processes of metallic layers. The side surface 7 is designated as the surface which is exposed when the transducer chips 1' are sawn separate from each other along the lines 9 and 10 from the multilayer wafers 8 illustrated in FIG. 3.

The ohmic contact areas 5' are fabricated individually to each separated chip using e.g. laser-based deposition processes of metallic layers which are described in, i.e., the following publications:

R. Solanki et al., "Low-Temperature Refractory Metal Film Deposition," Appl. Phys. Lett., 41, (11), Dec. 1, 1982.

R. M. Osgood et al., "Laser Microchemistry for Direct Writing of Microstructures," Proc. SPIE, 385, 112...117, 1983.

Dieter Bäuerle, "Laser-Induced Chemical Vapor Deposition," in "Laser Processing and Diagnostics," ed. D. Bäuerle, Springer Verlag, 1984.

T. Cacouris et al., "Laser Direct Writing of Aluminium Conductors," Appl. Phys. Lett., 52, (22), May 30, 1988.

The transducer chips 1' are taken for metallization into a gas-tight chamber, whose construction allows introduction of an appropriate gas and has a laser-light transmitting window on top of the chamber. The transducer chips 1' are individually aligned one by one under the laser light so that a focused beam can hit one of the areas 5' of the conductive layer 2'. The illuminated spot 5' is heated by the impinging laser light and the gas filling the chamber that contains a desired metal, e.g., aluminium, gold or nickel, is pyrolyzed (or alternatively, photolyzed) at the hot spot 5'. This results in the reduction of the metal with a consequential deposition of metal to form the contact area 5' onto the semiconductor material surface. The contact area has typically a diameter of 0.1...0.5 mm and metal layer thickness of 0.1...0.5 μm. With the help of the laser, temperature at the spot 5' can be elevated sufficiently high, typically to several hundred degrees Celsius, which is needed to provide a good ohmic contact between the metallization and the semiconductor material. After completion of the metallization process at one spot, the laser beam is focused on the next spot 5' and the process is repeated.

Alternative methods for the metallization of the spot 5' are, e.g., vapour deposition, sputtering and electrolytic or self-catalyzed (electroless plating) deposition of a metal layer on the sawn side surface of the transducer structure, after which the desired contact area pattern can be achieved by means of metallization removal from desired areas by laser trimming, etching through a photosensitive and patterned polymer resist layer, or mechanical trimming by sand-blasting or abrasion. The electrolytic plating method can be applied to provide metallization to all conductive surfaces of the transducer structure. This approach leaves the insulating layers automatically nonmetallized. If the large-area metallization produces no deleterious effect, this process is the simplest possible deposition method of the metallic layer. An alternative method is to produce metallization directly through a mechanically fabricated or other kind of mask to desired areas. The mask can be fabricated from, e.g., a photosensitive polymer by exposing and developing the desired pattern onto the polymer, or alternatively, by patterning a layer of, e.g., polyimide plastic with the help of an excimer laser or similar light source.

The ohmic contacts can be fabricated to the side surface of the transducer structure using, e.g., an eutectic gold-silicon alloy, which can also be used for bonding metallic conductors or similar elements to the side of the multilayer structure. Thermal and compression bonding can then be applied to produce an ohmic contact with the help of the metallic alloy between the semiconductor material and the metallic conductor.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A transducer formed from generally planar alternating conductive and insulating layers deposited onto a wafer, the wafer being generally planar and being separated in a direction generally perpendicular to the plane in a matrix pattern to form a plurality of individual transducer elements, each transducer element having alternating conductive and insulating layers corresponding to the wafer and having vertical surfaces generally perpendicular to the conductive and insulating layers, the conductive layers of each transducer element extending between the vertical surfaces thereof, and each transducer element having electrical conducts applied to the conductive layers, each of the electrical contacts being placed on one of the vertical surfaces of the transducer elements and laying within edges of the conductive layer to which the electrical contact is applied, the electrical contacts being placed on the conductive layers by a placing process.

2. The transducer in accordance with claim 1, wherein the contact areas are formed at the vertical surfaces of the transducer elements through mask fabrication from a material which is exposed and then develops desired openings in the mask.

3. The transducer in accordance with claim 2, wherein the material is a photosensitive polymer plastic.

4. A method for forming a transducer comprising the steps of:
depositing generally planar, alternating conductive and insulating layers on a wafer;
separating the wafer in a matrix pattern to form a plurality of individual transducer elements, the wafer being separated generally perpendicularly to the planar conductive and insulating layers whereby each of the transducer elements formed have a plurality of vertical surfaces, each of the conductive layers in the transducer elements extending between the vertical surfaces thereof; and
placing electrical contacts on the vertical surfaces of the transducer elements by a placing process, each of the electrical contacts being in contact with one of the conductive layers of the transducer element.

5. The method for forming a transducer according to claim 4, wherein the step of placing electrical contacts results in each electrical contact lying within edges of the conductive layer to which the electrical contact is applied such that the electrical contact only engages one conductive layer of the transducer element.

6. A transducer produced in accordance with the steps of claim 5.

7. The method for forming a transducer according to claim 4, wherein the placing process is a laser-based deposition process.

8. The method for forming a transducer according to claim 7, further comprising the step of carrying out the laser-based deposition in a gas-tight chamber filed with a gas containing a desired metal, said chamber having a laser-light transmitting top window and the laser-based deposition further comprises the step of heating a desired spot of the transducer element with a laser beam whereby the metal-containing gas is pyrolyzed at the desired spot to form an electrical contact.

9. The method for forming a transducer according to claim 4, wherein the placing process is a vapor deposition process.

10. The method for forming a transducer according to claim 4, wherein the placing process is a sputtering deposition process.

11. The method for forming a transducer according to claim 4, wherein the placing process is an electrolytic plating process.

12. The method for forming a transducer according to claim 4, wherein the placing process is an autocatalytic plating process.

13. The method for forming a transducer according to claim 4, wherein the placing process uses mask fabrication from a material which is exposed and then develops desired openings in the mask.

14. The method for forming a transducer according to claim 13, wherein the material is a photosensitive polymer plastic and the electrical contact is formed in the desired opening.

15. A transducer produced in accordance with the steps of claim 4.

* * * * *